(12) United States Patent
Zhou (10) Patent No.: US 11,171,144 B2
(45) Date of Patent: Nov. 9, 2021

(54) SEMICONDUCTOR STRUCTURE AND METHOD FOR FORMING SAME

(71) Applicants: Semiconductor Manufacturing International (Shanghai) Corporation, Shanghai (CN); Semiconductor Manufacturing International (Beijing) Corporation, Beijing (CN)

(72) Inventor: Fei Zhou, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 100 days.

(21) Appl. No.: 16/601,920

(22) Filed: Oct. 15, 2019

(65) Prior Publication Data

US 2020/0411532 A1 Dec. 31, 2020

(30) Foreign Application Priority Data

Jun. 28, 2019 (CN) .......................... 201910579446.7

(51) Int. Cl.
*H01L 27/11* (2006.01)

(52) U.S. Cl.
CPC ...... *H01L 27/1116* (2013.01); *H01L 27/1104* (2013.01)

(58) Field of Classification Search
CPC ......... H01L 27/1116; H01L 21/823431; H01L 27/0886; H01L 21/823821; H01L 27/0924; H01L 21/823814; H01L 27/1104
See application file for complete search history.

(56) References Cited

U.S. PATENT DOCUMENTS

| 2019/0148514 A1* | 5/2019 | Lin | H01L 29/66545 257/401 |
| 2020/0105620 A1* | 4/2020 | Tan | H01L 21/3065 |

* cited by examiner

*Primary Examiner* — Thanh Y. Tran (57) ABSTRACT

A semiconductor structure and a method for forming same are provided, the method including: providing a base including a substrate and a fin protruding from the substrate, the substrate including a P-type logic region and a pull up transistor region; forming a gate layer across the fin; forming a mask spacer covering a side wall of a fin in the pull up transistor region and a side wall of a portion of a fin in the P-type logic region; removing a portion of thicknesses of the fins on both sides of the gate layer using the mask spacer as a mask, to form a groove enclosed by the fin and the mask spacer in the P-type logic region and a straight slot penetrating the fin and the mask spacer in the pull up transistor region along a direction perpendicular to the side wall of the fin; and forming a P-type source/drain doped layer in the groove and the straight slot. A mask spacer on a side wall of the groove limits excessive growth of a P-type source/drain doped layer, and the straight slot enables a P-type source/drain doped layer in the P-type logic region to have a relatively large width size, thereby reducing an impact on performance of a logic device and reducing a probability of bridging between P-type source/drain doped layers in adjacent pull up transistor regions.

12 Claims, 5 Drawing Sheets

SEMICONDUCTOR STRUCTURE AND METHOD FOR FORMING SAME

RELATED APPLICATIONS

The present application claims priority to Chinese Patent Appln. No. 201910579446.7, filed Jun. 28, 2019, the entire disclosure of which is hereby incorporated by reference.

BACKGROUND

Technical Field

Embodiments and implementations of the present disclosure relate to the field of semiconductor manufacturing, and in particular, to a semiconductor structure and a method for forming same.

Related Art

In semiconductor manufacturing, with the development of extremely large-scale integrated circuits, feature sizes of the integrated circuits have become increasingly small. In order to be adapted to the reduced feature sizes, a channel length of a metal-oxide-semiconductor field-effect transistor (MOSFET) becomes increasingly short. However, as a channel length of a device becomes shorter, a distance between a source and a drain of the device becomes shorter accordingly. As a result, a capability of a gate to control the channel deteriorates, and it is increasingly difficult for the gate to pinch the channel off, resulting in a larger probability of a sub-threshold leakage, that is, the so-called short-channel effect (SCE).

Therefore, in order to be better adapted to the reduced feature sizes, semiconductor processes have gradually transitioned from a planar MOSFET to a three-dimensional transistor with higher efficacy, such as a fin field effect transistor (FinFET). In the FinFET, the gate may control a fin from at least two sides. Compared to a planar MOSFET, the gate has a stronger control capability on a channel and can better suppress the short-channel effect. Moreover, compared to other devices, the FinFET has better compatibility with current integrated circuit in manufacturing.

SUMMARY

A problem to be addressed in embodiments and implementations of the present disclosure is to provide a semiconductor structure and a method for forming same, so as to improve performance of a device.

To address the foregoing problem, embodiments and implementations of the present disclosure provide a method for forming a semiconductor structure. In one form, the method includes: providing a base including a substrate and a fin protruding from the substrate, the substrate including a P-type logic region for forming a logic device and a pull up transistor region for forming an SRAM device; forming a gate layer across the fin, the gate layer covering a portion of a top and a portion of a side wall of the fin; forming a mask spacer, the mask spacer covering a side wall of a fin in the pull up transistor region and a side wall of a portion of a fin in the P-type logic region; removing a portion of thicknesses of the fin on both sides of the gate layer using the mask spacer as a mask, to form a groove enclosed by the fin and the mask spacer in the P-type logic region and a straight slot penetrating the fin and the mask spacer in the pull up transistor region along a direction perpendicular to the side wall of the fin; and forming a P-type source/drain doped layer in the groove and the straight slot.

In some implementations, the step of forming the mask spacer includes: forming a mask material layer conformally covering the top and the side wall of the fin; performing ion injection on a mask material layer on a side wall of a portion of fins on both sides of the gate layer in the P-type logic region, to reduce etching resistance of a to-be-removed mask material layer on the side wall of the fin; and after the ion injection, etching the mask material layer along a direction perpendicular to a surface of the substrate using an anisotropic etching process.

In some implementations, an angle between an injection direction of the ion injection and a normal of the surface of the substrate is from 7 degrees to 15 degrees.

In some implementations, an injected ion of the ion injection includes at least one of an Ar ion, an N ion, or a He ion.

In some implementations, a parameter of the ion injection includes: an injected ion of Ar, injection energy of 5 KeV to 30 KeV, and an injection dose of 1E14 atoms per square centimeter to 1E16 atoms per square centimeter.

In some implementations, the anisotropic etching process is a dry etching process.

In some implementations, the mask spacer is made of a nitrogen-containing dielectric material.

In some implementations, the mask spacer is made of silicon nitride, silicon carbide nitride, boron silicon nitride, nitrogen silicon oxycarbide, or silicon oxynitride.

In some implementations, the P-type source/drain doped layer is formed using a selective epitaxial process.

In some implementations, in the step of forming the P-type source/drain doped layer, a top of the P-type source/drain doped layer is higher than a top of the mask spacer, where a P-type source/drain doped layer located in the groove has a first width, and a source/drain doped layer exposed from the groove has a second width, the second width being greater than the first width.

In some implementations, a distance from the top of the P-type source/drain doped layer to the top of the mask spacer is less than or equal to 7 nm.

In some implementations, before the forming the gate layer, the method further includes: forming an isolation layer on the substrate exposed from the fin, the isolation layer covering a portion of the side wall of the fin; and after the portion of the thicknesses of the fins on both sides of the gate layer is removed, a bottom face of the groove being lower than a top face of the isolation layer.

In some implementations, a distance between the bottom face of the groove and the top face of the isolation layer is from 4 nm to 8 nm.

Embodiments and implementations of the present disclosure further provide a semiconductor structure. In one form, a semiconductor structure includes: a base, including a substrate and a fin protruding from the substrate, the substrate including a P-type logic region for forming a logic device and a pull up transistor region for forming an SRAM device; a gate layer across the fin, the gate layer covering a portion of a top and a portion of a side wall of the fin; a mask spacer covering a side wall of a fin in the pull up transistor region and a side wall of a portion of a fin in the P-type logic region; a groove located in fins on both sides of the gate layer in the pull up transistor region, the groove being enclosed by the mask spacer and the fin; and a straight slot located in fins on both sides of the gate layer in the P-type logic region, the straight slot penetrating the fin and the mask spacer along a direction perpendicular to the side wall of the fin; and a P-type source/drain doped layer located in the groove and the straight slot.

In some implementations, the P-type source/drain doped layer includes an epitaxial layer doped with a P-type ion.

In some implementations, a top of the P-type source/drain doped layer is higher than a top of the mask spacer, a P-type source/drain doped layer located in the groove has a first width, and a P-type source/drain doped layer exposed from the groove has a second width, the second width being greater than the first width.

In some implementations, a distance from the top of the P-type source/drain doped layer to the top of the mask spacer is less than or equal to 7 nm.

In some implementations, the semiconductor structure further includes an isolation layer located on the substrate exposed from the fin, the isolation layer covering a portion of the side wall of the fin; and a bottom face of the groove being lower than a top face of the isolation layer.

In some implementations, a distance between the bottom face of the groove and the top face of the isolation layer is from 4 nm to 8 nm.

Compared to the prior art, technical solutions of embodiments and implementations of the present disclosure have the following advantages:

In embodiments and implementations of the present disclosure, a mask spacer is formed, the mask spacer covering the side wall of the fin in the pull up transistor region and the side wall of the portion of the fin in the P-type logic region, and therefore, after the portion of the thicknesses of the fins on both sides of the gate layer using the mask spacer as a mask, a groove enclosed by the fin and the mask spacer in the logic region and a straight slot penetrating the fin and the mask spacer in the pull up transistor region along the direction perpendicular to the side wall of the fin are formed; two opposite side walls in the groove are mask spacers, the mask spacer exposed from the side wall of the groove can limit excessive growth of the P-type source/drain doped layer, to confine the P-type source/drain doped layer in the groove, so that an excessively large width size of the P-type source/drain doped layer in the pull up transistor region is avoided, thereby reducing a probability of bridging between P-type source/drain doped layers in adjacent pull up transistor regions; and in addition, the straight slot penetrates the fin and the mask spacer in the P-type logic region along the direction perpendicular to the side wall of the fin, so that the P-type source/drain doped layer of the P-type logic region can still have a relatively large width size to ensure normal performance of a logic device. In summary, in embodiments and implementations of the present disclosure, not only an impact on the logic device is reduced, but also a probability of bridging between the P-type source/drain doped layers in the adjacent pull up transistor regions is reduced, thereby improving the performance of the device.

DETAILED DESCRIPTION

Performance of a current device can still be improved. Reasons for improvement of a current device are now analyzed in combination with a semiconductor structure.

Figure 1:
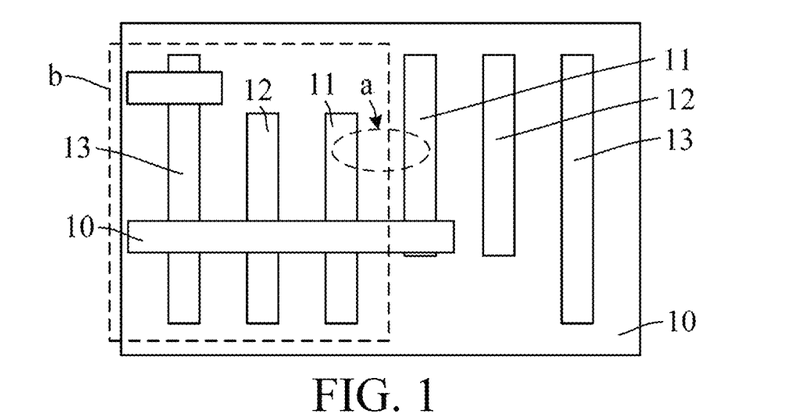
FIG. 1 is a top view of one form of a semiconductor structure.

Referring to FIG. 1, a top view of a semiconductor structure is shown. The semiconductor structure may be an SRAM device, for example. The semiconductor structure includes: a substrate 10; a fin protruding from the substrate 10, the fin including a first fin 11, a second fin 12, and a third fin 13. The first fin 11 is configured to form a pull up (PU) transistor, the second fin 12 is configured to form a pull down (PD) transistor, and the third fin 13 is configured to form a pass gate (PG) transistor. The pull up transistor is a PMOS transistor, and the pull down transistor and the pass gate transistor are NMOS transistors.

In a dashed line box b in FIG. 1, one pull up transistor, one pull down transistor, and one pass gate transistor are shown, and the first fin 11, the second fin 12, and the third fin 13 share one gate structure 10.

The semiconductor structure generally further includes a source/drain doped layer (not shown) located in fins on both sides of the gate structure 10. However, as a feature size of an integrated circuit becomes increasingly small, a spacing between adjacent fins becomes increasingly small. Therefore, it is likely to result in bridging between source/drain doped layers in adjacent first fins 11 at a position shown by a dashed line circle a.

Moreover, in addition to an SRAM device formed on the substrate 10, a logic device is further formed. Therefore, in order to avoid an adverse effect on performance of the logic device, it is currently difficult to relieve the foregoing bridging phenomenon by reducing a width size of a source/drain doped layer.

To address the technical problem, embodiments and implementations of the present disclosure provide a method for forming a semiconductor structure. In one form, a method includes: providing a base including a substrate and a fin protruding from the substrate, the substrate including a P-type logic region for forming a logic device and a pull up transistor region for forming an SRAM device; forming a gate layer across the fin, the gate layer covering a portion of a top and a portion of a side wall of the fin; forming a mask spacer, the mask spacer covering a side wall of a fin in the pull up transistor region and a side wall of a portion of a fin in the P-type logic region; removing a portion of thicknesses of the fins on both sides of the gate layer using the mask spacer as a mask, to form a groove enclosed by the fin and the mask spacer in the P-type logic region and a straight slot penetrating the fin and the mask spacer in the pull up transistor region along a direction perpendicular to the side wall of the fin; and forming a P-type source/drain doped layer in the groove and the straight slot.

In embodiments and implementations of the present disclosure, two opposite side walls in the groove are mask spacers, the mask spacer exposed from the side wall of the groove can limit excessive growth of the P-type source/drain doped layer, to confine the P-type source/drain doped layer in the groove, so that an excessively large width size of the P-type source/drain doped layer in the pull up transistor region is avoided, thereby reducing a probability of bridging between P-type source/drain doped layers in adjacent pull up transistor regions; and in addition, the straight slot penetrates the fin and the mask spacer in the P-type logic region along the direction perpendicular to the side wall of the fin, so that the P-type source/drain doped layer in the P-type logic region can still have a relatively large width size to ensure normal performance of a logic device. In summary, in embodiments and implementations of the present disclosure, not only an impact on the logic device is reduced, but also a probability of bridging between the P-type source/ drain doped layers in the adjacent pull up transistor regions is reduced, thereby improving the performance of the device.

To make the foregoing objectives, features, and advantages of the present disclosure clearer and easier to understand, specific embodiments and implementations of the present disclosure are described in detail below with reference to the accompanying drawings.

FIG. 2 to FIG. 12 are respective schematic structural diagrams of steps in one form of a method for forming a semiconductor structure according to the present disclosure.

Figure 2:
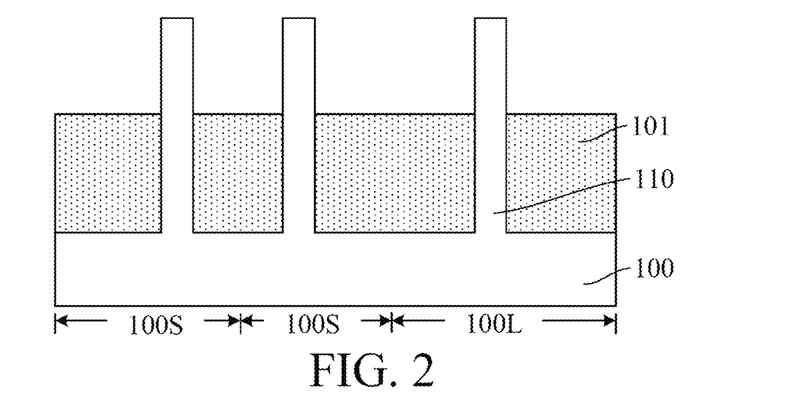
FIG. 2 to FIG. 12 are respective schematic structural diagrams of steps in one form of a method for forming a semiconductor structure according to the present disclosure.

Referring to FIG. 2, a base is provided, including a substrate 100 and a fin 110 protruding from the substrate 100, the substrate 100 including a P-type logic region 100L for forming a logic device and a pull up transistor region 100S for forming an SRAM device.

The substrate 100 is configured to provide a process platform for forming the logic device and the SRAM device subsequently.

In some implementations, the substrate 100 is a silicon substrate. In other implementations, the substrate may also be made of other materials such as germanium, silicon germanium, silicon carbide, gallium arsenide, or indium gallium, and the substrate may also be other types of substrates such as a silicon substrate on an insulator or a germanium substrate on an insulator.

In some implementations, the fin 110 and the substrate 100 are of an integrated structure. In other implementations, the fin may also be a semiconductor layer epitaxially growing on the substrate, to control a height of the fin precisely. To this end, in some implementations, the fin 110 is made of a material same as that of the substrate 100, and the fin 110 is made of silicon. In other implementations, the fin may also be made of a semiconductor material suitable for forming the fin, such as germanium, silicon germanide, silicon carbide, gallium arsenide, or gallium indium. The material of the fin may also be different from the material of the substrate.

In some implementations, the pull up transistor region 100S is configured to form a pull up transistor in an SRAM device, and each SRAM device includes two pull up transistors. Therefore, the substrate 100 includes two adjacent pull up transistors regions 100S.

In some implementations, the P-type logic region 100L is configured to form a P-type logic device. The P-type logic device includes one or more of a P-type standard threshold voltage (Standard VT, SVT) transistor, a P-type ultra-low threshold voltage (Ultra-low VT, ULVT) transistor, a P-type low threshold voltage (Low VT, LVT) transistor, a P-type high threshold voltage (High VT, HVT) transistor, and a P-type input/output (I/O) transistor.

In some implementations, for ease of illustration, a case in which the P-type logic region 100L and the pull up transistor region 100S are adjacent is shown.

Referring to FIG. 2, the forming method further includes: forming an isolation layer 101 on the substrate 100 exposed from the fin 110, the isolation layer 101 covering a portion of the side wall of the fin 110.

The isolation layer 101 is used as a shallow trench isolation (STI) structure for isolating adjacent devices. In some implementations, the isolation layer 101 is made of silicon oxide. In other implementations, the isolation layer may also be made of other insulating materials such as silicon nitride or silicon oxynitride.

In some implementations, the isolation layer 101 is formed through a deposition step, a planarization step, and an etching back step sequentially performed.

Figure 3:
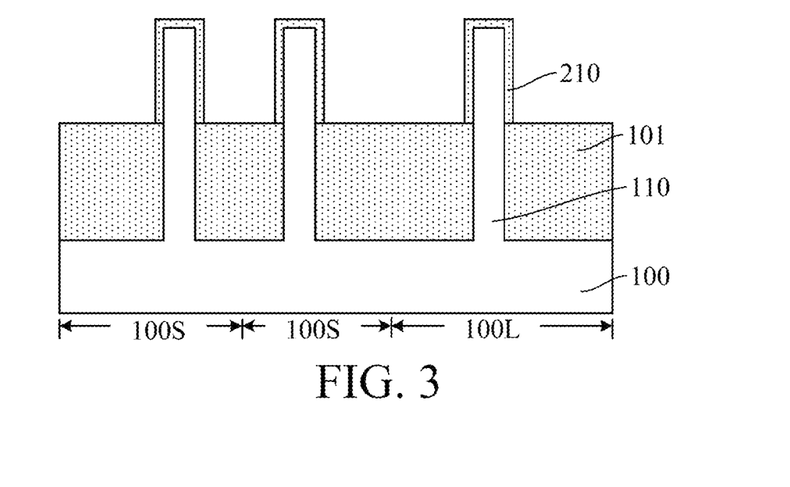
Figure 4:
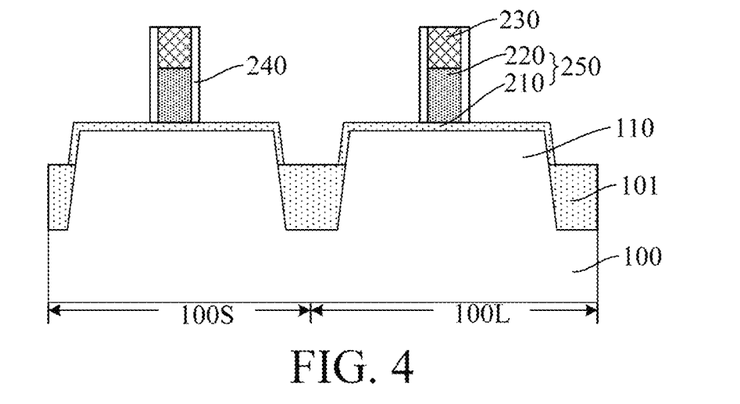

Referring to FIG. 3 to FIG. 4, FIG. 3 is a cross-sectional view along a direction perpendicular to an extending direction of the fin, and FIG. 4 is a cross-sectional view along the extending direction of the fin. After the isolation layer 101 is formed, a gate layer 220 across the fin 110 is formed (shown in FIG. 4), the gate layer 220 covering a portion of a top and a portion of a side wall of the fin 110.

In some implementations, the gate layer 220 is configured to form a gate structure 250.

In particular, the gate structure 250 is a dummy gate structure, where the gate structure 250 is configured to occupy a spatial position for forming a metal gate structure subsequently.

In some implementations, the gate layer 220 is made of polysilicon. In other implementations, the gate layer may also be made of amorphous carbon.

In some implementations, a gate mask layer 230 is formed on a top of the gate layer 220, the gate mask layer 230 being used as an etching mask for forming the gate layer 220.

In some implementations, after the isolation layer 101 is formed and before the gate layer 220 is formed, the method further includes: forming a gate oxide layer 210 on a surface of a fin 110 exposed from the isolation layer 101.

The gate oxide layer 210 is also used as a part of the gate structure 250. In addition, during subsequent etching to remove the gate layer 220, a surface of the gate oxide layer 210 is configured to define a stop position of the etching process, thereby reducing a probability of causing a damage to the fin 110.

In some implementations, the gate oxide layer 210 is made of silicon oxide. In other implementations, the gate oxide layer may also be made of silicon oxynitride.

In some implementations, after the gate layer 220 is formed, the method further includes: forming a spacer 240 on a side wall of the gate layer 220.

The spacer 240 is configured to protect the side wall of the gate layer 220, and is further configured to define a region for subsequently forming a source/drain doped layer, so that there is a specific distance between the source/drain doped layer and the gate layer 220.

The spacer 240 may be made of at least one of silicon oxide, silicon nitride, silicon carbide, silicon carbide nitride, nitrogen silicon oxycarbide, silicon oxynitride, boron nitride, or boron carbonitride, and the spacer 240 may be a single-layer structure or a laminated-layer structure. In some implementations, the spacer 240 is a single-layer structure, and the spacer 240 is made of silicon nitride.

In some implementations, after the spacer 240 is formed, the gate layer 220 and the gate oxide layer 210 exposed from the spacer 240 are retained. In other implementations, the gate layer and the gate oxide layer exposed from the spacer may also be removed.

With reference to and referring to FIG. 5 to FIG. 10, a mask spacer 350 (shown in FIG. 9) is formed, the mask spacer 350 covering a side wall of a fin 110 in the pull up transistor region 100S and a side wall of a portion of a fin 110 in the P-type logic region 100L.

Figure 9:
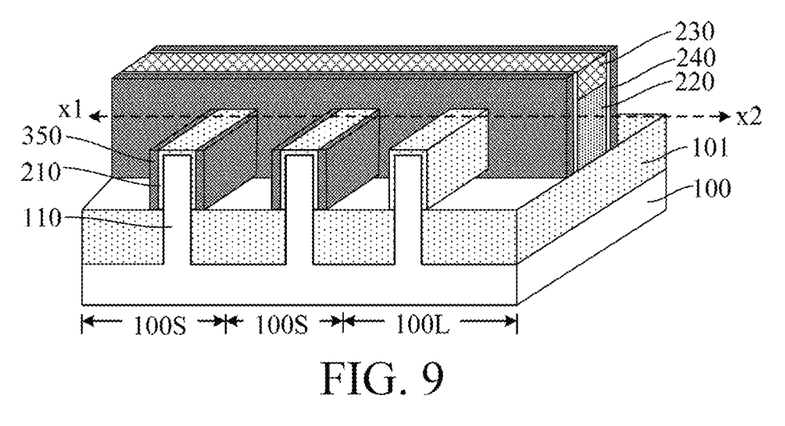

The mask spacer 350 on the side wall of the fin 110 serves to protect the side wall of the fin 110, to prevent subsequent epitaxial growth on the side wall of the fin 110.

In some implementations, the mask spacer 350 is made of a nitrogen-containing dielectric material. The nitrogen-containing dielectric material has a relatively high density, and can effectively protect the side wall of the fin 110.

In particular, the mask spacer 350 may be made of silicon nitride, silicon carbide nitride, boron silicon nitride, nitrogen silicon oxycarbide, or silicon oxynitride. In some implementations, the mask spacer 350 is made of silicon nitride.

In some implementations, the mask spacer 350 covers the portion of the fin 110 in the P-type logic region 100L, that is, in the P-type logic region 100L, a portion of fin 110 whose side wall is exposed from the mask spacer 350 is a portion to be removed subsequently.

In some implementations, the step of forming the mask spacer 350 includes the following steps.

Figure 5:
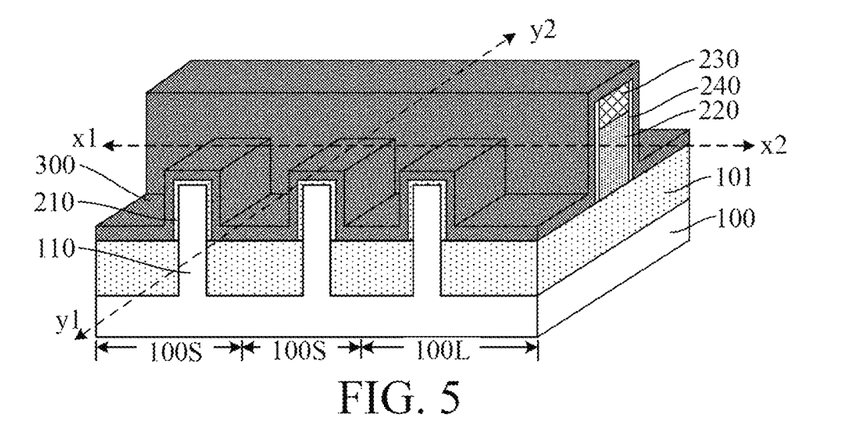
Figure 6:
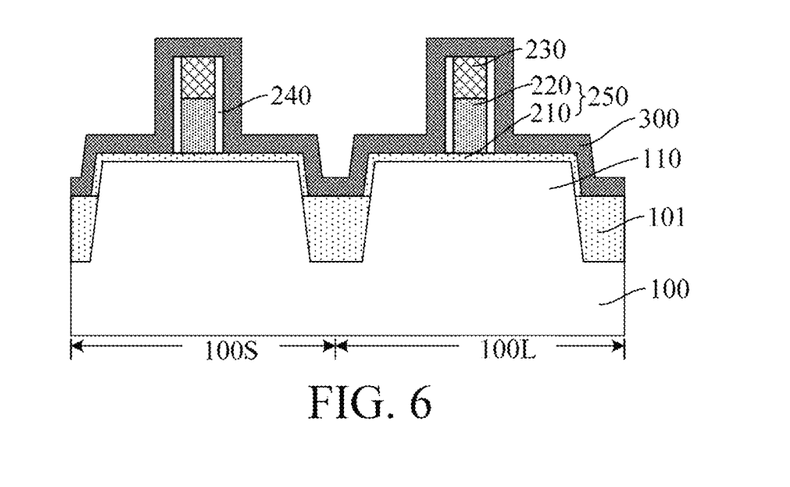
Figure 7:
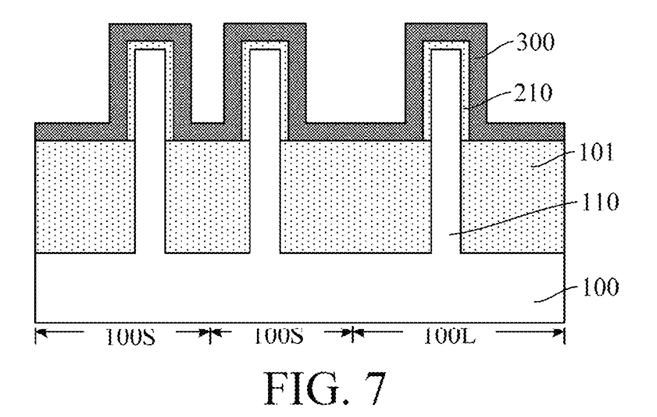

With reference to and referring to FIG. 5 to FIG. 7, FIG. 5 is a three-dimensional view, FIG. 6 is a cross-sectional view of FIG. 5 taken along a secant line y1y2, and FIG. 7 is a cross-sectional view of FIG. 5 along a secant line x1x2. A mask material layer 300 conformally covering the top and the side wall of the fin 110 is formed.

The mask material layer 300 is configured to provide a process basis for forming a mask spacer on the side wall of the fin 110.

In some implementations, the mask material layer 300 is made of silicon nitride.

In particular, the mask material layer 300 is formed using an atomic layer deposition process. The atom layer deposition process includes performing a plurality of times of atom layer deposition circulation to form a mask material layer 300 with a required thickness. Selection of the atom layer deposition process facilitates improvement of thickness uniformity of the mask material layer 300, so that the thickness of the mask material layer 300 can be controlled precisely. In addition, the atom layer deposition process has good gap filling performance and step coverage performance, so that a conformal covering capability of the mask material layer 300 is increased correspondingly.

In other implementations, the mask material layer may also be formed using a chemical vapour deposition process.

Therefore, in the step of forming the mask material layer 300, the mask material layer 300 further covers the top and the side wall of the gate layer 220 and the surface of the gate oxide layer 210, and further covers a top of the isolation structure 101.

Figure 8:
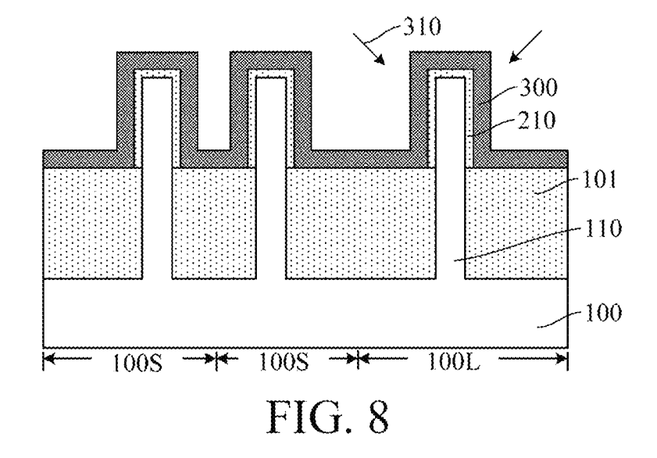

Referring to FIG. 8, FIG. 8 is a cross-sectional view based on FIG. 7. Ion injection 310 is performed on a mask material layer 300 on a side wall of a portion of fins 110 on both sides of the gate layer 220 (shown in FIG. 6) in the P-type logic region 100L, to reduce etching resistance of a to-be-removed mask material layer 300 on the side wall of the fin 100.

The mask material layer 300 is subsequently etched along a direction perpendicular to a surface of the substrate 100 using an anisotropic etching process, to form the mask spacer located on the side wall of the fin 110. The ion injection 310 is performed on the mask material layer 300 on the side wall of portion of the fins 110 on both sides of the gate layer 220 in the P-type logic region 100L, to reduce etching resistance of a mask material layer 300 affected by the ion injection 310, so that a rate of etching, using an anisotropic etching process, the mask material layer 300 affected by the ion injection 310 subsequently is relatively high. Therefore, during the subsequent anisotropic etching process, not only a mask material layer 300 on a top of the fin 110 can be removed, but also the mask material layer 300 affected by the ion injection 310 can also be removed, so that the mask spacer exposes the side wall of the portion of the fin 110 in the P-type logic region 100L.

In some implementations, a lattice of the mask material layer 300 is destroyed by an impure ion under ion bombardment through the ion injection 310, so that the mask material layer 300 affected by the ion injection 310 becomes loose, thereby helping remove the mask material layer during the anisotropic etching process.

In particular, a step of the ion injection 310 includes: forming a first pattern layer (not shown) covering the mask material layer 300, the first pattern layer exposing the side wall of the portion of the fins 110 on both sides of the gate layer 220 in the P-type logic region 100L and a mask material layer 300 on a portion of the top of the fin 110, and the first pattern layer exposing a to-be-removed portion of the mask material layer 300 on the side wall of the fin 110; performing ion injection 310 on the mask material layer 300 exposed from the first pattern layer; and after the ion injection 310, removing the first pattern layer.

In some implementations, the first pattern layer is made of a photoresist. After the ion injection 310, the first pattern layer may be removed through wet stripping or ashing.

In some implementations, an injected ion of the ion injection 310 includes one or more of an Ar ion, an N ion, and a He ion. A relative molecular mass of an element corresponding to the foregoing ion is relatively large, helping significantly reduce a density of the mask material layer 300 affected by the ion injection 310, thereby improving a rate of removing the mask material layer 300 using the anisotropic etching process.

In some implementations, the ion injection 310 is performed using the Ar ion. The Ar ion is a frequently-used neutral ion with high process compatibility and a low process risk.

An injection angle of ion injection 310 should be neither excessively small nor excessively large. An excessively small injection angle or an excessively large injection angle both result in difficulty in uniformly doping the mask material layer 300 on the side wall of the portion of the fin 110 in the P-type logic region 100L with impure ions, and therefore it is difficult to completely remove the mask material layer 300 on the side wall of the portion of the fin 110 in the P-type logic region 100L. In other words, after the mask spacer is subsequently formed, it is difficult for the mask spacer to expose the side wall of the portion of the fin 110 in the P-type logic region 100L. To this end, in some implementations, the injection angle of the ion injection process is from 7 degrees to 15 degrees. The injection angle refers to an angle between an injection direction of the ion injection and a normal of the surface of the substrate 100.

An injection dose of the ion injection 310 should be neither excessively low nor excessively high. A lower injection dose leads to lower impure ion doping concentration in the mask material layer 300 correspondingly, and therefore little damage is caused to the to-be-removed mask material layer 300 on the side wall of the fin 100, impeding reduction of the etching resistance of the to-be-removed mask material layer 300 on the side wall of the fin 100. If the injection dose is extremely high, impure ion doping concentration in the mask material layer 300 is extremely high correspondingly, and the impure ions are likely to diffuse into the fin 110, affecting subsequent etching of the fin 110. To this end, in some implementations, the injection dose of the ion injection process is from 1E14 atoms per square centimeter to 1E16 atoms per square centimeter.

Injection energy of the ion injection 310 should be neither excessively small nor excessively large. If the injection energy is excessively small, an impure ion injection depth is excessively small correspondingly, resulting in difficulty in ensuring that a mask material layer 300 in an entire thickness range is doped with impure ions, and it is difficult to completely remove the mask material layer 300 on the side wall of the portion of the fin 110 in the P-type logic region 100L during the subsequent anisotropic etching process. If the injection energy is excessively large, it is likely to lead a surface of the mask material layer 300 to be doped with no impure ions. Correspondingly, the mask material layer 300 on the side wall of the portion of the fin 110 in the P-type logic region 100L cannot be removed. In addition, impure ions are also likely to be injected into the fin 110, affecting subsequent etching of the fin 110. To this end, in some implementations, the injection energy of the ion injection 310 is from 5 KeV to 30 KeV.

Figure 10:
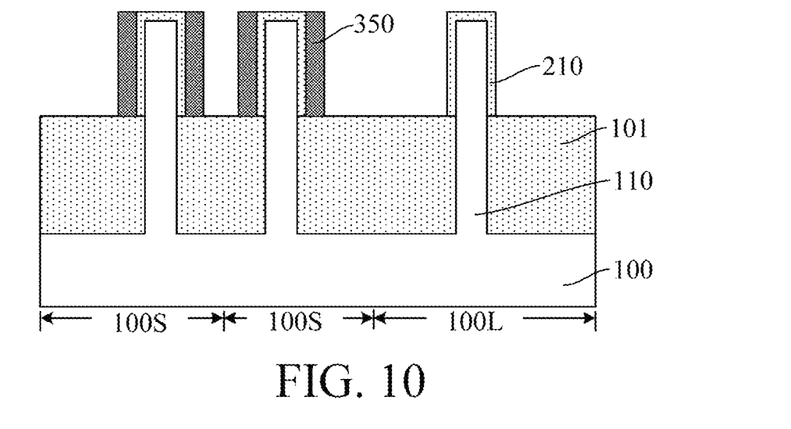

With reference to and referring to FIG. 9 to FIG. 10, FIG. 9 is a three-dimensional view, and FIG. 10 is a cross-sectional view of FIG. 9 along a secant line x1x2. After the ion injection 310 (shown in FIG. 8), the mask material layer 300 is etched along a direction perpendicular to the surface of the substrate 100 using anisotropic etching process, leaving a remaining mask material layer 300 as a mask spacer 350.

After the mask spacer 350 is formed, the mask spacer 350 exposes the fins 110 on both sides of the gate layer 220, thereby preparing for etching the fins 110 on both sides of the gate layer 220 subsequently.

During etching of the mask spacer 350 located on tops of the fins 110 on both sides of the gate layer 220, mask material layers 300 located on the top of the gate layer 220 and on the isolation layer 101 are further etched to expose the tops of the gate layer 220 and the isolation layer 101. Therefore, the mask spacer 350 further covers the side wall of the gate layer 220.

In the anisotropic etching process, not only the top of the fin 110 is exposed, but also the mask spacer 350 on the side wall of the fin 110 can be retained.

In some implementations, the anisotropic etching process is a dry etching process. The dry etching process is a simple frequently-used anisotropic etching process.

It should be noted that the mask material layer 300 on the side wall of the portion of the fins 110 on both sides of the gate layer 220 (shown in FIG. 6) in the P-type logic region 100L is affected by the ion injection 310, and a density of the mask material layer 300 affected by the ion injection 310 is relatively low. Therefore, during the anisotropic etching process, the mask material layer 300 affected by the ion injection 310 is also removed, so that the mask spacer 350 exposes a gate oxide layer 210 on the side wall of the portion of the fin 110 in the P-type logic region 100L.

In some implementations, a gate oxide layer 210 is formed on a surface of the fin 110. Therefore, after the mask spacer 350 is formed, the mask spacer 350 exposes the gate oxide layer 210.

Figure 11:
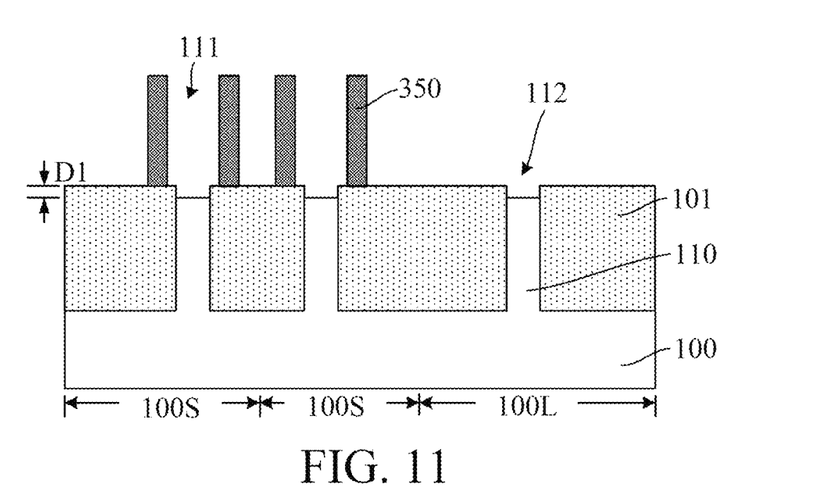

Referring to FIG. 11, a portion of thicknesses of the fins 110 on both sides of the gate layer 220 (shown in FIG. 6) is removed using the mask spacer 350 as a mask, to form a groove 111 enclosed by the fin 100 in the P-type logic region 100L and the mask spacer 350 and a straight slot 112 penetrating the fin 110 in the pull up transistor region 100S and the mask spacer 350 along a direction perpendicular to the side wall of the fin 110.

The groove 111 is configured to provide a spatial position for forming a P-type source/drain doped layer in the P-type logic region 100L subsequently, and the straight slot 112 is configured to form a provide a spatial position for forming a P-type source/drain doped layer in the pull up transistor region 100S subsequently.

The mask spacer 350 covers the side wall of the portion of the fin 110 in the P-type logic region 100L. Therefore, after the portion of the thicknesses of the fins 110 on both sides of the gate layer 220 is removed, the straight slot 112 formed in the pull up transistor region 100S penetrates the fin 110 and the mask spacer 350.

In some implementations, the portion of the thicknesses of the fins 110 on both sides of the gate layer 220 is removed using an anisotropic etching process. In particular, the anisotropic etching process may be reactive ion etching.

It should be noted that before the portion of the thicknesses of the fins 110 on both sides of the gate layer 220 is removed, the method further includes: forming a second graphic layer (not shown) on the isolation layer 101, the second graphic layer covering the gate layer 220 and a portion of the mask spacer 350 and a portion of the fins 110 on both sides of the gate layer 220 to expose a to-be-removed portion of the fin 110.

The second pattern layer is configured to cover regions that are not desired to be etched in the P-type logic region 100L and in the pull up transistor region 100S.

In some implementations, the second pattern layer is made of a photoresist material.

It should be noted that a gate oxide layer 210 is formed on the surface of the fin 110. Therefore, before the portion of the thicknesses of the fins 110 on both sides of the gate layer 220 are removed, the method further includes: removing, using the second pattern layer, the gate oxide layer 210 on the top of the fin 110 to expose the top of the fin 110.

It should be further noted that after the portion of the thickness of the fin 110 is etched, the method further includes: etching the exposed gate oxide layer 210 to increase volumes and width sizes of the groove 111 and the straight slot 112, so that width sizes of P-type source/drain doped layer in the groove 111 and the straight slot 112 are increased, and therefore an area of a top surface of a P-type source/drain doped layer higher than the groove 111 and the straight slot 112 is relatively large. In addition, the mask spacer 350 can still limit excessive growth of the P-type source/drain doped layer in the groove 111.

In some implementations, the groove 111 and the straight slot 112 are formed in a same step, and therefore, bottom faces of the groove 111 and the straight slot 112 are flush.

The groove 111 is used as an example. In some implementations, the bottom face of the groove 111 is lower than the top face of the isolation layer 101.

The groove 111 is enclosed by the fin 100 and the mask spacer 350 in the P-type logic region 100L. Two opposite side walls in the groove 111 are mask spacers 350. When a P-type source/drain doped layer is subsequently formed in the groove 111 using a selective epitaxial process, a mask spacer 350 exposed from a side wall of the groove 111 can limit excessive growth of the P-type source/drain doped layer. Therefore, the bottom face of the groove 111 is lower than the top face of the isolation layer 101 to increase a volume of the P-type source/drain doped layer in the groove 111, thereby enabling a stress generated by the P-type source/drain doped layer to meet a performance requirement of a device.

However, a distance D1 from the bottom face of the groove 111 to the top face of the isolation layer 101 should be neither excessively small nor excessively large. If the distance D1 is excessively small, it is likely to lead to an excessively small volume of the P-type source/drain doped layer formed in the groove 111, affecting the stress generated by the P-type source/drain doped layer. If the distance D1 is excessively large, difficulty in an etching process is correspondingly increased and wastes of process costs and time are caused. In addition, the volume of the P-type source/drain doped layer in the groove 111 is excessively large, causing an adverse effect on performance of the device. To this end, in some implementations, the distance D1 between the bottom face of the groove 111 and the top face of the isolation layer 101 is from 4 nm to 8 nm.

Figure 12:
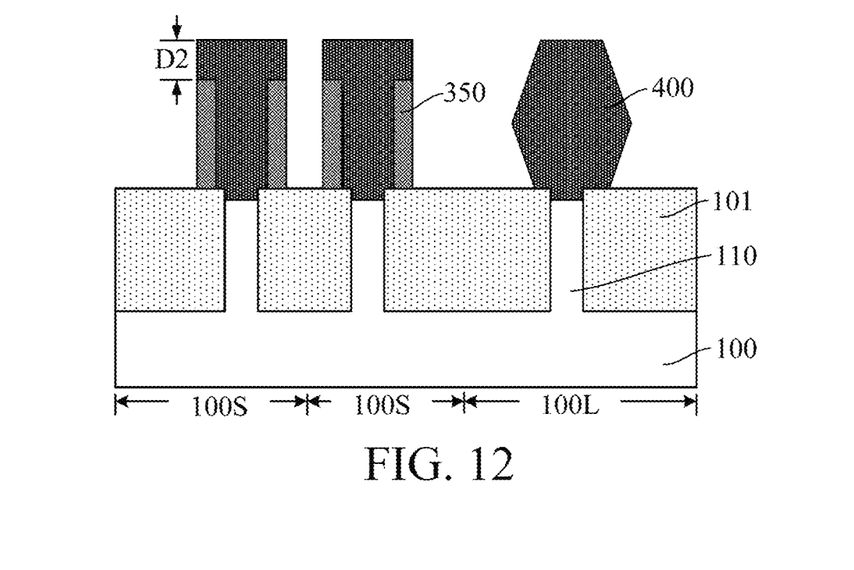

Referring to FIG. 12, a P-type source/drain doped layer 400 is formed in the groove 111 (shown in FIG. 11) and the straight slot 112 (shown in FIG. 11).

In some implementations, the P-type source/drain doped layer 400 is formed using a selective epitaxial process. During the selective epitaxial process, P-type ions are self-doped in-situ to form the P-type source/drain doped layer 400.

In other words, the P-type source/drain doped layer 400 includes an epitaxial layer doped with P-type ions. The epitaxial layer is configured to provide a pressure stress effect on a channel region of a pull up transistor and a P-type logic device, to improve carrier mobilities of the pull up transistor and a P-type logic device. In particular, the epitaxial layer may be made of Si or SiGe.

The two opposite side walls in the groove 111 are mask spacers 350. During epitaxial growth, the mask spacer 350 exposed from the side wall of the groove 111 can limit excessive growth of the P-type source/drain doped layer 400, to confine the P-type source/drain doped layer 400 in the groove 111, so that an excessively large width size of the P-type source/drain doped layer 400 in the pull up transistor region 100S is avoided, thereby reducing a probability of bridging between P-type source/drain doped layers 400 in adjacent pull up transistor regions 100S; and in addition, the straight slot 112 penetrates the fin 110 and the mask spacer 350 in the P-type logic region 100L along the direction perpendicular to the side wall of the fin 110, so that the P-type source/drain doped layer 400 in the P-type logic area 100L can still have a relatively large width size to ensure normal performance of a logic device. In summary, in some implementations, not only an impact on the logic device is reduced, but also the probability of bridging between the P-type source/drain doped layers 400 in the adjacent pull up transistor regions 100S is reduced, thereby improving the performance of the device.

In some implementations, after the P-type source/drain doped layer 400 is formed in the groove 111 and the straight slot 112, a top of the P-type source/drain doped layer 400 is higher than a top of the mask spacer 350. In addition, due to characteristics of the selective epitaxial process, a P-type source/drain doped layer 400 located in the groove 111 has a first width (not labeled), and a source/drain doped layer 400 exposed from the groove 111 has a second width (not labeled), the second width being greater than the first width, so that an area of a top surface of the P-type source/drain doped layer 400 is increased.

However, a distance D2 from the top of the P-type source/drain doped layer 400 to the top of the mask spacer 350 should not be excessively large. A larger distance D2 leads to a larger volume of the source/drain doped layer 400 exposed from the groove 111. Therefore, if the distance D2 is excessively large, the volume of the source/drain doped layer 400 exposed from the groove 111 is likely to be excessively large, and consequently a risk of bridging between adjacent source/drain doped layers 400 is increased. To this end, in some implementations, the distance D2 from the top of the P-type source/drain doped layer 400 to the top of the mask spacer 350 is less than or equal to 7 nm.

Correspondingly, the present disclosure further provides a semiconductor structure. Referring to FIG. 12, a schematic structural diagram of an embodiment of a semiconductor structure according to the present disclosure is shown.

One form of the semiconductor structure includes: a base, including a substrate 100 and a fin 110 protruding from the substrate 100, the substrate 100 including a P-type logic region 100L for forming a logic device and a pull up transistor region 100S for forming an SRAM device; a gate layer 220 (shown in FIG. 9) across the fin 110, the gate layer 220 covering a portion of a top and a portion of a side wall of the fin 110; a mask spacer 350 covering a side wall of a fin 110 in the pull up transistor region 100S and a side wall of a portion of a fin 110 in the P-type logic region 100L; a groove 111 (shown in FIG. 11) located in fins 110 on both sides of the gate layer 220 in the pull up transistor region 100S, the groove 111 being enclosed by the mask spacer 350 and the fin 110; and a straight slot 112 (shown in FIG. 11) located in fins 110 on both sides of the gate layer 220 in the P-type logic region 100L, the straight slot 112 penetrating the fin 110 and the mask spacer 350 along a direction perpendicular to the side wall of the fin 110; and a P-type source/drain doped layer 400 located in the groove 111 and the straight slot 112.

In some implementations, the substrate 100 is a silicon substrate. In other implementations, the substrate may also be made of other materials such as germanium, silicon germanium, silicon carbide, gallium arsenide, or indium gallium, and the substrate may also be other types of substrates such as a silicon substrate on an insulator or a germanium substrate on an insulator.

In some implementations, the fin 110 and the substrate 100 are of an integrated structure. In other implementations, the fin may also be a semiconductor layer epitaxially growing on the substrate, to control a height of the fin precisely.

To this end, in some implementations, the fin 110 is made of a material same as that of the substrate 100, and the fin 110 is made of silicon. In other implementations, the fin may also be made of a semiconductor material suitable for forming the fin, such as germanium, silicon germanide, silicon carbide, gallium arsenide, or gallium indium. The material of the fin may also be different from the material of the substrate.

In some implementations, the pull up transistor region 100S is configured to form a pull up transistor in an SRAM device, and each SRAM device includes two pull up transistors. Therefore, the substrate 100 includes two adjacent pull up transistors regions 100S.

In some implementations, the P-type logic region 100L is configured to form a P-type logic device. The P-type logic device includes one or more of an SVT transistor, a ULVT transistor, an LVT transistor, an HVT transistor, and an 10 transistor.

In some implementations, for ease of illustration, a case in which the P-type logic region 100L and the pull up transistor region 100S are adjacent is shown.

The semiconductor structure further includes an isolation layer 101 located on the substrate 100 exposed from the fin 110, the isolation layer 101 covering a portion of the side wall of the fin 110.

The isolation layer 101 is used as a shallow trench isolation structure for isolating adjacent devices. In some implementations, the isolation layer 101 is made of silicon oxide. In other implementations, the isolation layer may also be made of other insulating materials such as silicon nitride or silicon oxynitride.

In some implementations, the gate layer 220 is configured to form a gate structure 250 (shown in FIG. 6).

In particular, the gate structure 250 is a dummy gate structure, the gate structure 250 being configured to occupy a spatial position for forming a metal gate structure subsequently.

In some implementations, the gate layer 220 is made of polysilicon. In other implementations, the gate layer may also be made of amorphous carbon.

In some implementations, the semiconductor structure further includes a gate oxide layer 210 (shown in FIG. 9) located between the gate layer 220 and the fin 110.

The gate oxide layer 210 is also used as a part of the gate structure 250. In some implementations, the gate oxide layer 210 is made of silicon oxide. In other implementations, the gate oxide layer may also be made of silicon oxynitride.

In some implementations, a spacer 240 (shown in FIG. 9) is formed on a side wall of the gate layer 220.

The spacer 240 is configured to protect the side wall of the gate layer 220, and is further configured to define a region for forming a source/drain doped layer subsequently, so that there is a specific distance between the source/drain doped layer and the gate layer 220.

The spacer 240 may be made of one or more of silicon oxide, silicon nitride, silicon carbide, silicon carbide nitride, nitrogen silicon oxycarbide, silicon oxynitride, boron nitride, and boron carbonitride, and the spacer 240 may be a single-layer structure or a laminated-layer structure. In some implementations, the spacer 240 is a single-layer structure, and the spacer 240 is made of silicon nitride.

The mask spacer 350 located on the side wall of the fin 110 serves to protect the side wall of the fin 110, to prevent epitaxial growth on the side wall of the fin 110 during forming of the source/drain doped layer 400.

In some implementations, the mask spacer 350 is made of a nitrogen-containing dielectric material. The nitrogen-containing dielectric material has a relatively high density, and can effectively protect the side wall of the fin 110.

In particular, the mask spacer 350 may be made of silicon nitride, silicon carbide nitride, boron silicon nitride, nitrogen silicon oxycarbide, or silicon oxynitride. In some implementations, the mask spacer 350 is made of silicon nitride.

The groove 111 is configured to provide a spatial position for forming a P-type source/drain doped layer 400 in the P-type logic region 100L, and the straight slot 112 is configured to provide a spatial position for forming a P-type source/drain doped layer 400 in the pull up transistor region 100S.

In some implementations, the mask spacer 350 covers the side wall of the fin 110 in the pull up transistor region 100S. Therefore, the groove 111 is located in the fins 110 on both sides of the gate layer 220 in the pull up transistor region 100S, and the groove 111 is enclosed by the mask spacer 350 and the fin 110.

In some implementations, the mask spacer 350 covers a portion of a side wall of a fin 110 in the P-type logic region 100L. Therefore, the straight slot 112 is located in the fins 110 on both sides of the gate layer 220 in the P-type logic region 100L, and penetrates the fin 110 and the mask spacer 350 along a direction perpendicular to the side wall of the fin 110.

Two opposite side walls in the groove 111 are mask spacers 350. The P-type source/drain doped layer 400 is formed through epitaxial growth. During epitaxial growth, the mask spacer 350 exposed from the side wall of the groove 111 can limit excessive growth of the P-type source/drain doped layer 400, to confine the P-type source/drain doped layer 400 in the groove 111, so that an excessively large width size of the P-type source/drain doped layer 400 in the pull up transistor region 100S is avoided, thereby reducing a probability of bridging between P-type source/drain doped layers 400 in adjacent pull up transistor regions 100S; and in addition, the straight slot 112 penetrates the fin 110 and the mask spacer 350 in the P-type logic region 100L along the direction perpendicular to the side wall of the fin 110, so that the P-type source/drain doped layer 400 in the P-type logic area 100L can still have a relatively large width size to ensure normal performance of a logic device. In summary, in some implementations, not only an impact on the logic device is reduced, but also the probability of bridging between the P-type source/drain doped layers 400 in the adjacent pull up transistor regions 100S is reduced, thereby improving the performance of the device.

Moreover, the groove 111 is enclosed by the mask spacer 350 and the fin 110, and the straight slot 112 penetrates the fin 110 and the mask spacer 350 along the direction perpendicular to the side wall of the fin 110, that is, no gate oxide layer 210 is formed in the groove 111 and the straight slot 112, increasing volumes and width sizes of the groove 111 and the straight slot 112, so that width sizes of P-type source/drain doped layers 400 in the groove 111 and the straight slot 112 are increased, and therefore an area of a top surface of a P-type source/drain doped layer 400 higher than tops of the groove 111 and the straight slot 112 is also relatively large. In addition, the mask spacer 350 can still serve to limit excessive growth of the P-type source/drain doped layer 400 in the groove 111.

In some implementations, the groove 111 and the straight slot 112 are formed in a same step, and therefore, bottom faces of the groove 111 and the straight slot 112 are flush.

The groove 111 is used as an example. In some implementations, the bottom face of the groove 111 is lower than the top face of the isolation layer 101.

The groove 111 is enclosed by the fin 100 and the mask spacer 350 in the P-type logic region 100L. Two opposite side walls in the groove 111 are mask spacers 350, and a mask spacer 350 exposed from a side wall of the groove 111 can limit excessive growth of the P-type source/drain doped layer 400. Therefore, the bottom face of the groove 111 is lower than the top face of the isolation layer 101 to increase a volume of the P-type source/drain doped layer 400 in the groove 111, thereby enabling a stress generated by the P-type source/drain doped layer 400 to meet a performance requirement of a device.

However, a distance D1 (shown in FIG. 11) from the bottom face of the groove 111 to the top face of the isolation layer 101 should be neither excessively small nor excessively large. If the distance D1 is excessively small, it is likely to result in an excessively small volume of the P-type source/drain doped layer 400 located in the groove 111, affecting the stress generated by the P-type source/drain doped layer 400. The groove 111 is formed through an etching process. If the distance D1 is excessively large, difficulty in the etching process is increased correspondingly, and wastes of process costs and time are caused. In addition, the volume of the P-type source/drain doped layer 400 in the groove 111 is excessively large, causing an adverse effect on performance of the device. To this end, in some implementations, the distance D1 between the bottom face of the groove 111 and the top face of the isolation layer 101 is from 4 nm to 8 nm.

It should be noted that a procedure of forming the mask spacer 350 generally includes a deposition step and an etching step. Therefore, the mask spacer 350 further covers the side wall of the gate layer 220.

In some implementations, the P-type source/drain doped layer 400 is generally formed through epitaxial growth. Therefore, the P-type source/drain doped layer 40 includes an epitaxial layer doped with P-type ions. The epitaxial layer is configured to provide a pressure stress effect on a channel region of a pull up transistor and a P-type logic device, to improve carrier mobilities of the pull up transistor and the P-type logic device.

In particular, the epitaxial layer may be made of Si or SiGe.

In some implementations, a top of the P-type source/drain doped layer 400 is higher than a top of the mask spacer 350. In addition, due to characteristics of the selective epitaxial process, a P-type source/drain doped layer 400 located in the groove 111 has a first width, and a source/drain doped layer 400 exposed from the groove 111 has a second width, the second width being greater than the first width, so that an area of a top surface of the P-type source/drain doped layer 400 is increased.

However, a distance D2 from the top of the P-type source/drain doped layer 400 to the top of the mask spacer 350 should not be excessively large. A larger distance D2 leads to a larger volume of the source/drain doped layer 400 exposed from the groove 111.

Therefore, if the distance D2 is excessively large, the volume of the source/drain doped layer 400 exposed from the groove 111 is likely to be excessively large, and consequently a risk of bridging between adjacent source/drain doped layers 400 is increased. To this end, in some implementations, the distance D2 from the top of the P-type source/drain doped layer 400 to the top of the mask spacer 350 is less than or equal to 7 nm.

The semiconductor structure may be formed using the forming method described in the foregoing embodiments, or may be formed using other forming methods. For detailed descriptions of the semiconductor structure in some implementations, reference may be made to the respective descriptions in the foregoing embodiments, and details are not described again in this embodiment.

Although embodiment and implementations of the present disclosure are discussed above, the present disclosure is not limited thereto. Various changes and modifications may be made by those skilled in the art without departing from the spirit and scope of the present disclosure, and thus the protection scope of the present disclosure should be subject to the scope defined by the claims.

What is claimed is:

1. A method for forming a semiconductor structure, comprising:
    providing a base comprising a substrate and a fin protruding from the substrate, where the substrate comprises a P-type logic region for forming a logic device and a pull up transistor region for forming an SRAM device;
    forming a gate layer across the fin, the gate layer covering a portion of a top and a portion of a side wall of the fin;
    forming a mask spacer, the mask spacer covering a side wall of the fin in the pull up transistor region and the portion of the side wall of the fin in the P-type logic region;
    removing a portion of thicknesses of fins on both sides of the gate layer using the mask spacer as a mask, to form a groove enclosed by the fin and the mask spacer in the P-type logic region and a straight slot penetrating the fin and the mask spacer in the pull up transistor region along a direction perpendicular to the side wall of the fin; and
    forming a P-type source/drain doped layer in the groove and the straight slot;
    wherein the step of forming the mask spacer comprises:
        forming a mask material layer conformally covering the top and the side wall of the fin;
        performing ion injection on the mask material layer on the portion of the side wall of the fins on both sides of the gate layer in the P-type logic region, to reduce etching resistance of a to-be-removed mask material layer on the side wall of the fin; and
        after the ion injection, etching the mask material layer along a direction perpendicular to a surface of the substrate using an anisotropic etching process.

2. The method for forming a semiconductor structure according to claim 1, wherein an angle between an injection direction of the ion injection and a normal of the surface of the substrate is from 7 degrees to 15 degrees.

3. The method for forming a semiconductor structure according to claim 1, wherein an injected ion of the ion injection comprises at least one of an Ar ion, an N ion, or a He ion.

4. The method for forming a semiconductor structure according to claim 1, wherein a parameter of the ion injection comprises: an injected ion of Ar, injection energy of 5 KeV to 30 KeV, and an injection dose of 1E14 atoms per square centimeter to 1E16 atoms per square centimeter.

5. The method for forming a semiconductor structure according to claim 1, wherein the anisotropic etching process is a dry etching process.

6. The method for forming a semiconductor structure according to claim 1, wherein the mask spacer is made of a nitrogen-containing dielectric material.

7. The method for forming a semiconductor structure according to claim 6, wherein the mask spacer is made of silicon nitride, silicon carbide nitride, boron silicon nitride, nitrogen silicon oxycarbide, or silicon oxynitride.

8. The method for forming a semiconductor structure according to claim 1, wherein the P-type source/drain doped layer is formed using a selective epitaxial process.

9. The method for forming a semiconductor structure according to claim 1, wherein:
    in the step of forming the P-type source/drain doped layer, a top of the P-type source/drain doped layer is higher than a top of the mask spacer; and
    the P-type source/drain doped layer located in the groove has a first width, and the source/drain doped layer exposed from the groove has a second width, the second width being greater than the first width.

10. The method for forming a semiconductor structure according to claim 9, wherein a distance from the top of the P-type source/drain doped layer to the top of the mask spacer is less than or equal to 7 nm.

11. The method for forming a semiconductor structure according to claim 1, wherein:
    the method further comprises: before forming the gate layer, forming an isolation layer on the substrate exposed from the fin, where the isolation layer covers a portion of the side wall of the fin; and
    after the portion of the thicknesses of the fins on both sides of the gate layer is removed, a bottom face of the groove is lower than a top face of the isolation layer.

12. The method for forming a semiconductor structure according to claim 11, wherein a distance between the bottom face of the groove and the top face of the isolation layer is from 4 nm to 8 nm.

* * * * *